(12) United States Patent
Takahashi

(10) Patent No.: US 8,975,958 B2
(45) Date of Patent: Mar. 10, 2015

(54) POWER SUPPLY CIRCUIT AND POWER SUPPLY CONTROL METHOD

(75) Inventor: Kiyohiko Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 98 days.

(21) Appl. No.: 13/989,972

(22) PCT Filed: Nov. 30, 2011

(86) PCT No.: PCT/JP2011/078226
§ 371 (c)(1),
(2), (4) Date: May 28, 2013

(87) PCT Pub. No.: WO2012/074133
PCT Pub. Date: Jun. 7, 2012

(65) Prior Publication Data
US 2013/0241658 A1    Sep. 19, 2013

(30) Foreign Application Priority Data

Dec. 2, 2010 (JP) ................................. 2010-269253

(51) Int. Cl.
*H03G 3/00* (2006.01)
*H03F 3/68* (2006.01)
(Continued)

(52) U.S. Cl.
CPC ................ *H03F 3/68* (2013.01); *H03F 1/0222* (2013.01); *H03F 1/0244* (2013.01);
(Continued)

(58) Field of Classification Search
USPC .................. 330/297, 279, 295, 127, 129, 134
See application file for complete search history.

(56) References Cited

U.S. PATENT DOCUMENTS

| 5,905,407 A | 5/1999 | Midya |
| 8,030,995 B2 * | 10/2011 | Okubo et al. ................. 330/127 |
| 8,237,499 B2 * | 8/2012 | Chen et al. ..................... 330/136 |

FOREIGN PATENT DOCUMENTS

| JP | 2003-533116 A | 11/2003 |
| JP | 2007-215158 A | 8/2007 |
| JP | 2010-258896 A | 11/2010 |

OTHER PUBLICATIONS

Donald F. Kimbal et al., "High-Efficiency Envelope-Tracking W-CDMA Base-Station Amplifier Using GaN HFETs", IEEE Transactions on Microwave Theory and Techniques, vol. 54, No. 11, Nov. 2006, pp. 3848-3856.

(Continued)

*Primary Examiner* — Hieu Nguyen
(74) *Attorney, Agent, or Firm* — Sughrue Mion, PLLC

(57) ABSTRACT

In a power supply circuit which uses a switching amplifier in combination with a linear amplifier, in order to be capable of correcting errors of operation of the switching amplifier and the linear amplifier, that is to say, in order to cause the switching amplifier and the linear amplifier to operate in coordination in a near-ideal state, the power supply circuit is provided with first amplification unit for delaying an input signal by a predetermined set time and amplifying the input signal, current detection unit for detecting a current value of an output signal of the first amplification unit, predicted signal generation unit for generating a pulse signal on a basis of an output signal of the current detection unit and the input signal, second amplification unit for amplifying the pulse signal and signal output unit for combining current of the output signal of the first amplification unit and current of the output signal of the second amplification unit to output the combined current, wherein the set time is time for reducing an effect of delay times generated at the current detection unit, the predicted signal generation unit and the second amplification unit.

10 Claims, 5 Drawing Sheets

(51) Int. Cl.
*H03F 1/02* (2006.01)
*H03F 3/217* (2006.01)
*H03F 3/24* (2006.01)

(52) U.S. Cl.
CPC ............. *H03F 3/2173* (2013.01); *H03F 3/245* (2013.01); *H03F 2200/351* (2013.01); *H03F 2200/432* (2013.01); *H03F 2200/462* (2013.01)
USPC .......................................... 330/127; 330/297

(56) References Cited

OTHER PUBLICATIONS

Tae-Woo Kwak et al., "A 2W Cmos Hybrid Switching Amplitude Modulator for Edge Polar Transmitters", IEEE International Solid-Stage Circuits Conference 2007, Session 29, Feb. 14, 2007, pp. 518-519, 619.
International Search Report of PCT Application No. PCT/JP2011/078226 mailed on Mar. 6, 2012.

* cited by examiner

POWER SUPPLY CIRCUIT AND POWER SUPPLY CONTROL METHOD

This application is a National Stage Entry of PCT/JP2011/078226 filed Nov. 30, 2011, which claims priority from Japanese Patent Application 2010-269253 filed Dec. 2, 2010, the contents of all of which are incorporated herein by reference, in their entirety.

TECHNICAL FIELD

The present invention relates to a power supply circuit and a power supply control method.

BACKGROUND ART

Modulation methods adopted by wireless communications such as cellular phones of recent years have high frequency utilization efficiency and at the same time, high peak to average power ratio (PAPR: Peak to Average Power Ratio). In order to amplify a signal to which an amplitude modulation is applied using a class AB amplifier used in the field of wireless communications before now, it is necessary to secure enough back-off to maintain linearity. Generally, this back-off needs to be as much as PAPR at least. In contrast, efficiency of class AB amplifiers becomes highest at the time of power saturation, and declines as back-off becomes larger. For this reason, the larger the PAPR of a high frequency modulation signal becomes, the more difficult to raise power efficiency of a power amplifier will be.

As a power amplifier which amplifies such a modulation signal of large PAPR with high efficiency, there is a polar modulation-type power amplifier. In the polar modulation-type power amplifier, the high frequency modulation signal used for wireless communication is generated from component of polar coordinates of amplitude and phase.

FIG. 6 is a block diagram of a polar modulation-type power amplifier disclosed in non-patent document 1. The amplifier concerned includes: a high frequency modulation signal input terminal 101, an amplitude signal input terminal 102, a power supply circuit 103, a high frequency power amplifier 104 and a high frequency modulation signal output terminal 105. Also, the power supply circuit 103 includes: a linear amplifier 106, a subtractor 107, a current sensing resistor 108, a hysteresis comparator 109, a switching amplifier 110, an inductor 111 and a power supply terminal 112.

From the high frequency modulation signal input terminal 101, a high frequency modulation signal to which an amplitude modulation or a phase modulation is applied is input, and sent to the high frequency power amplifier 104. From the amplitude signal input terminal 102, an amplitude signal of the high frequency modulation signal, which is input from the high frequency modulation signal input terminal 101, is input. The signal input from the amplitude signal input terminal 102 is amplified with high efficiency in the power supply circuit 103, and is supplied from the power supply terminal 112 as a power supply of the high frequency power amplifier 104. The high frequency power amplifier 104 amplifies the signal input from the high frequency modulation signal input terminal 101 and outputs it to the high frequency modulation signal output terminal 105.

The power supply circuit 103 has a structure including the linear amplifier 106 in combination with the switching amplifier 110 in order to amplify the input signal with high efficiency and low distortion. The amplitude signal input from the amplitude signal input terminal 102 is input to the linear amplifier 106.

The linear amplifier 106 has low output impedance, and performs linear amplification of the input signal and outputs the input signal. The signal output from the linear amplifier 106 is sent to the power supply terminal 112 via the current sensing resistor 108.

The subtractor 107 is connected to both ends of the current sensing resistor 108, and outputs a value which is subtracted a voltage of the power supply terminal 112 from a voltage of the output signal of the linear amplifier 106. At that time, since the input of the subtractor 107 is at high impedance, there will be no case where the subtractor 107 consumes the electric power supplied to the output signal of the linear amplifier 106 and the power supply terminal 112 largely.

Also, since impedance of the current sensing resistor 108 is set low, a voltage which is applied to both ends of the current sensing resistor 108 is negligibly small compared with the voltage applied to the power supply terminal 112.

The output signal of the subtractor 107 is input to the hysteresis comparator 109. The hysteresis comparator 109 performs plus or minus judgment of the input signal and outputs the result (pulse signal) to the switching amplifier 110. However, the hysteresis comparator 109 has a function to hold the last output state and hysteresis width (V_hys), and when the last output is Low, the output reverses to High when the input signal becomes not less than V_hys/2, and when the last output is High, the output reverses to Low when the input signal becomes not more than −V_hys/2.

The signal input to the switching amplifier 110 is amplified, and is output to the power supply terminal 112 via the inductor 111. At that time, an electric current supplied from the switching amplifier 110 via the inductor 111 is combined with an electric current supplied from the linear amplifier 106 via the current sensing resistor 108 and sent to the power supply terminal 112.

The power supply circuit 103 mentioned above has two advantages; linearity of the linear amplifier 106 and high efficiency of the switching amplifier 110. This is because, in the power supply circuit 103, the linear amplifier 106 of low output impedance decides the output voltage and most part of the output current is supplied from the switching amplifier 110 with high efficiency. The electric current output from the power supply terminal 112 is a sum of the output current of the linear amplifier 106 and the output current of the switching amplifier 110. An electric potential of the power supply terminal 112 is decided by the linear amplifier 106 with low output impedance. In order to keep the electric potential of the power supply terminal 112 at a value of a target, an electric current is supplied from the linear amplifier 106. The output current of the linear amplifier 106 is detected by the current sensing resistor 108 and the hysteresis comparator 109, and a supply current from the switching amplifier 110 is adjusted so that the output current of the linear amplifier 106 does not become excessive. By applying the method mentioned above, most of the electric current output from the power supply terminal 112 is supplied from the switching amplifier 110, and it is enough for the output current of the linear amplifier 106 only to correct an error component of the switching amplifier 110.

FIG. 7 is a block diagram of a power supply circuit disclosed in non-patent document 2. The power supply circuit includes: a signal input terminal 701, a linear amplifier 702, a current detector 703, amplifiers 704, 705 and 707, an adder 706, a PWM modulator 708, a switching amplifier 709, an inductor 710 and a signal output terminal 711. In the above, PWM is an abbreviation of Pulse Width Modulation.

A signal input from the signal input terminal 701 is supplied to the linear amplifier 702 and the amplifier 704. The linear amplifier 702 amplifies the signal supplied to the signal input terminal 701 and outputs the signal to the signal output terminal 711. The current detector 703 detects a current value of the signal output from the linear amplifier 702. The amplifier 704 adjusts amplitude of the signal supplied to the signal input terminal 701 and outputs the signal supplied to the signal input terminal 701. The amplifier 705 adjusts amplitude of the signal detected by the current detector 703 and outputs the signal detected by the current detector 703. The adder 706 calculates a sum of the output signal of the amplifier 704 and the output signal of the amplifier 705, and outputs the sum. The amplifier 707 adjusts amplitude of the signal output by the adder 706 and outputs the signal output by the adder 706. The PWM modulator 708 converts the output signal of the amplifier 707 into a 1 bit signal of PWM and outputs the 1 bit signal. The switching amplifier 709 amplifies the output signal of the PWM modulator 708 and outputs the output signal of the PWM modulator 708 to the signal output terminal 711 via the inductor 710. At that time, the current of the output signal of the switching amplifier 709 and the output signal of the linear amplifier 702 is combined.

Improvement is applied to non-patent document 2 on the basis of the circuit of non-patent document 1 so that the non-patent document 2 can perform control of the switching amplifier by the PWM modulation.

CITATION LIST

Non-Patent Document

[Non-patent document 1] Donald F. Kimbal, Jinho Jeong, Chin Hsia, Paul Draxler, Sandro Lanfranco, Walter Nagy, Kevin Linthicum, Lawrence E. Larson, Peter M. Asbeck, "High-Efficiency Envelope-Tracking W-CDMA Base-Station Amplifier Using GaN HFETs", IEEE TRANSACTIONS ON MICROWAVE THEORY AND TECHNIQUES, VOL. 54, NO. 11, NOVEMBER 2006, pp. 3848-3856.

[Non-patent document 2] Tae-Woo Kwak, Min-Chul Lee, Bae-Kun Choi, Hanh-Phuc Le, Gyu-Hyeong Cho, "A 2 W CMOS Hybrid Switching Amplitude Modulator for EDGE Polar Transmitters", IEEE International Solid-Stage Circuits Conference 2007, pp. 518-519.

Disclosure of the Invention

Problems to be Solved by the Invention

However, each power supply circuit disclosed in non-patent document 1 and non-patent document 2 has problems respectively.

The power supply circuit 103 of non-patent document 1 shown in FIG. 6 has a problem that the efficiency degrades when a high-speed signal is to be amplified. In the power supply circuit 103, if a time delay did not exist on an amplification route composed of the subtractor 107, the current sensing resistor 108, the hysteresis comparator 109, the switching amplifier 110 and the inductor 111, an ideal pulse signal would be generated by the hysteresis comparator 109. This is because, if effects of the delay becomes smaller, not only timing (phase) of the pulse signal but also a pattern (wave form) itself of the pulse signal are also improved. Specifically, if the delay on the amplification route mentioned above becomes smaller (in other words, circuits in the amplification route operate faster), it becomes possible to set a switching frequency of the pulse signal high. However, in case an operation delay exists on a route between detecting the output current of the linear amplifier 106 by the subtractor 107 and amplifying the output current by the switching amplifier 110 via the hysteresis comparator 109, operation of the switching amplifier 110 becomes not capable to follow operation of the linear amplifier 106 any more. For this reason, in case a high-speed signal is to be amplified, the linear amplifier 106 needs to operate in a form to correct the operation delay of the switching amplifier 110 As a result, the output power of the linear amplifier 106 with low efficiency increases, and efficiency of the power supply circuit 103 as a whole degrades.

It is very difficult to reduce the operation delay which is generated in the switching amplifier 110 by a design of a circuit. Especially, in case the power supply circuit 103 performs a high power output, transistor size of a final stage of the switching amplifier 110 becomes very large, and the delay time becomes large. This is because, since there exists an operation delay in each step of an input buffer circuit which drives the transistor, in order to drive a large transistor, it is necessary to connect the input buffer circuits in multiple steps and serially.

On the other hand, there is also a concern that the same problem as non-patent document 1 can be generated at non-patent document 2. The reason is, by the operation delay which is generated by the current detector 703, the amplifiers 705 and 707, the adder 706, the PWM modulator 708, the switching amplifier 709 and the inductor 710, it becomes impossible for operation of the switching amplifier 709 to follow operation of the linear amplifier 702 any more. By the way, in non-patent document 2, it is stated that there exists a function to correct a delay of such as the inductor 710 by the amplification route using the amplifier 704 and the adder 706. However, since the power supply circuit disclosed in non-patent document 2 does not include a mechanism to adjust a correction amount of the time delay, the effect to correct the operation delay is little.

The object of the present invention is to provide a power supply circuit and a power supply control method which are capable to correct errors of operation of the switching amplifier and the linear amplifier, in other words, to cause the switching amplifier and the linear amplifier to operate in coordination in a near-ideal state.

Means for Solving the Problems

A power supply circuit of the present invention includes: first amplification means for delaying an input signal by a predetermined set time and amplifying thereof; current detection means for detecting a current value of the output signal of the first amplification means; predicted signal generation means for generating a pulse signal on the basis of the output signal of the current detection means and the input signal; second amplification means for amplifying the pulse signal; and signal output means for combining the current of the output signal of the first amplification means and the output signal of the second amplification means to output thereof; and the set time is time for reducing an effect of delay times generated at the current detection means, the predicted signal generation means and the second amplification means.

A power supply control method of the present invention includes: delaying an input signal by a predetermined set time and amplifies and outputs thereof; detecting a current value of the delayed and amplified signal; generating a pulse signal on the basis of the detected current value and the input signal; amplifying the pulse signal; combining the current of the delayed and amplified signal and the amplified pulse signal and outputting thereof; and the set time is time for reducing an effect of delay times generated at detection of the current value, generation of the pulse signal and amplification of the pulse signal.

Effects of the Invention

According to the present invention, in a power supply circuit which uses a switching amplifier in combination with a linear amplifier, it becomes possible to correct errors of operation of the switching amplifier and the linear amplifier, in other words, to cause the switching amplifier and the linear amplifier to operate in coordination in a near-ideal state.

DESCRIPTION OF EXEMPLARY EMBODIMENTS

The First Exemplary Embodiment

Figure 1:
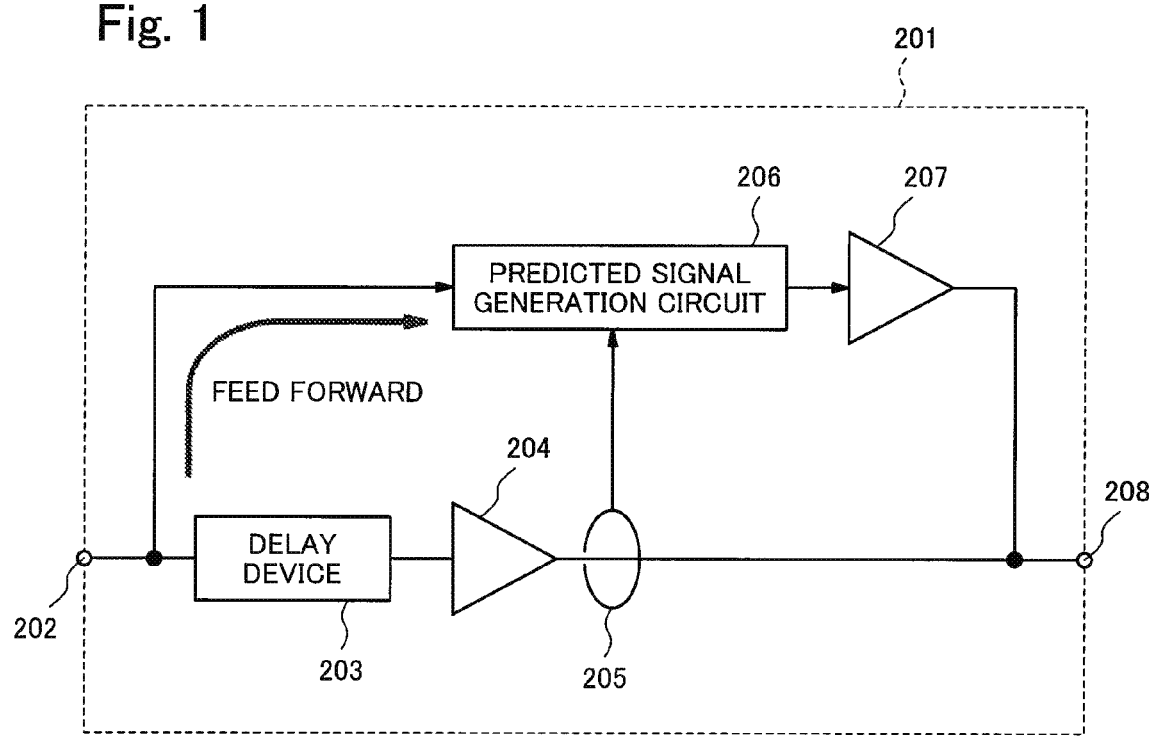
FIG. 1 A block diagram showing an exemplary structure of a power supply circuit according to the first exemplary embodiment of the present invention FIG. 2 A block diagram showing an exemplary structure of a predicted signal generation circuit shown in FIG. 1

FIG. 1 is a block diagram showing an exemplary structure of a power supply circuit 201 according to the first exemplary embodiment of the present invention. The power supply circuit 201 includes: a signal input terminal 202, a delay device 203, a linear amplifier 204 (a first amplifier), a current detector 205, a predicted signal generation circuit 206, a switching amplifier 207 (a second amplifier) and a signal output terminal 208.

The signal input terminal 202 inputs a target signal of an amplification.

The delay device 203 makes the signal input from the signal input terminal 202 delayed for a set time and outputs the delayed signal.

The linear amplifier 204 amplifies the output signal of the delay device 203 and outputs the amplified signal to the signal output terminal 208.

The current detector 205 detects a current value of the signal which the linear amplifier 204 output to the signal output terminal 208 and outputs the result of the detection to the predicted signal generation circuit 206.

The predicted signal generation circuit 206 generates a pulse signal (for example, pulse signal of a 1 bit) based on the signal which shows the output current of the linear amplifier 204 detected by the current detector 205 and the signal input from the signal input terminal 202.

The switching amplifier 207 amplifies the pulse signal output by the predicted signal generation circuit 206, combines the amplified pulse signal with the output signal of the linear amplifier 204 and outputs the combined signal to the output terminal 208.

Here, in the power supply circuit 201, operation of an amplification route including the current detector 205, the predicted signal generation circuit 206 and the switching amplifier 207 will be explained.

First, suppose a state in which a certain load (for example, resistor) is attached outside of the signal output terminal 208. In order to improve power efficiency, it is necessary for the electric current output from the signal output terminal 208 to be supplied from the switching amplifier 207 as much as possible. Here, the electric current which is output from the signal output terminal 208 is a sum of the output current of the linear amplifier 204 and the switching amplifier 207. And, the linear amplifier 204 operates as a voltage source and set a voltage of the signal output terminal 208 at a desired value.

When the output current of the switching amplifier 207 is smaller than the output current (output current from the signal output terminal 208 to outside) required to set the voltage of the signal output terminal 208 to the desired value, the linear amplifier 204 supplies the shortfall in the electric current. On the other hand, when the output current of the switching amplifier 207 is larger than the output current required to set the voltage of the signal output terminal 208 to the desired value, the linear amplifier 204 absorbs the excess electric current.

Accordingly, it is possible to know whether the output current of the switching amplifier 207 is in short or in excess of the electric current which should be output from the signal output terminal 208 by monitoring the output current of the linear amplifier 204. In the circuit of FIG. 1, excess or shortage of the output current of the switching amplifier 207 is determined by monitoring the output current of the linear amplifier 204, and a control signal of the switching amplifier 207 is being adjusted.

Figure 6:
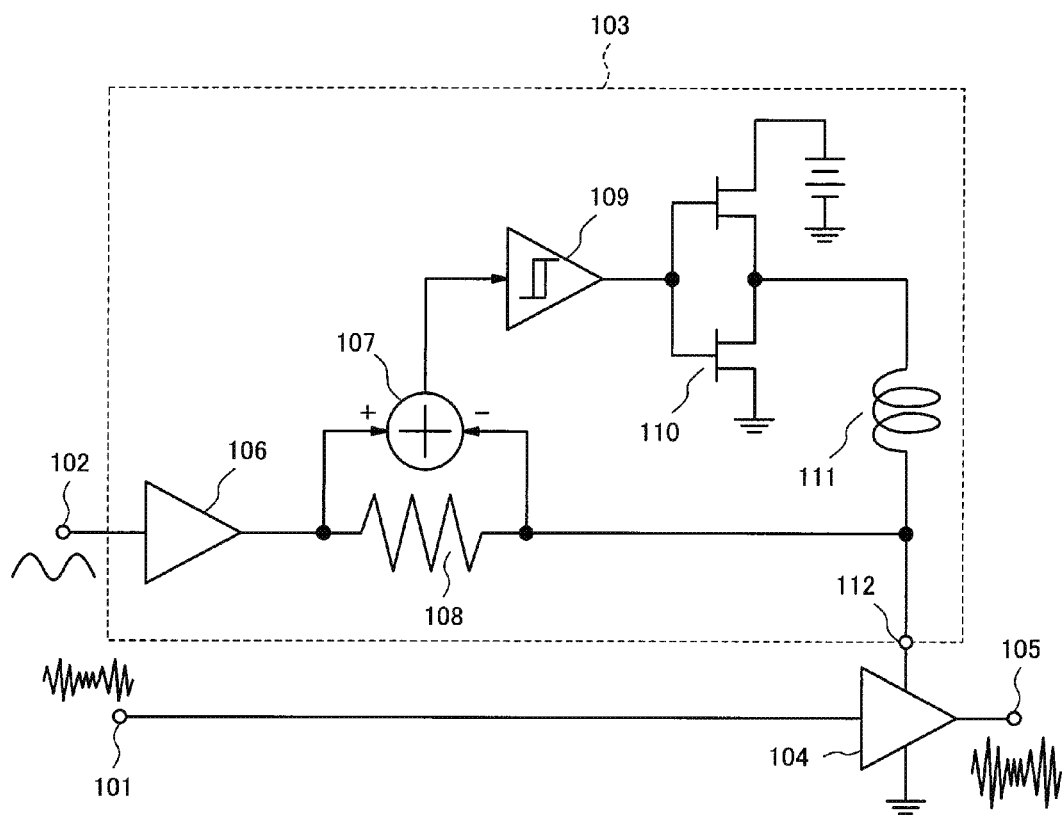
Figure 7:
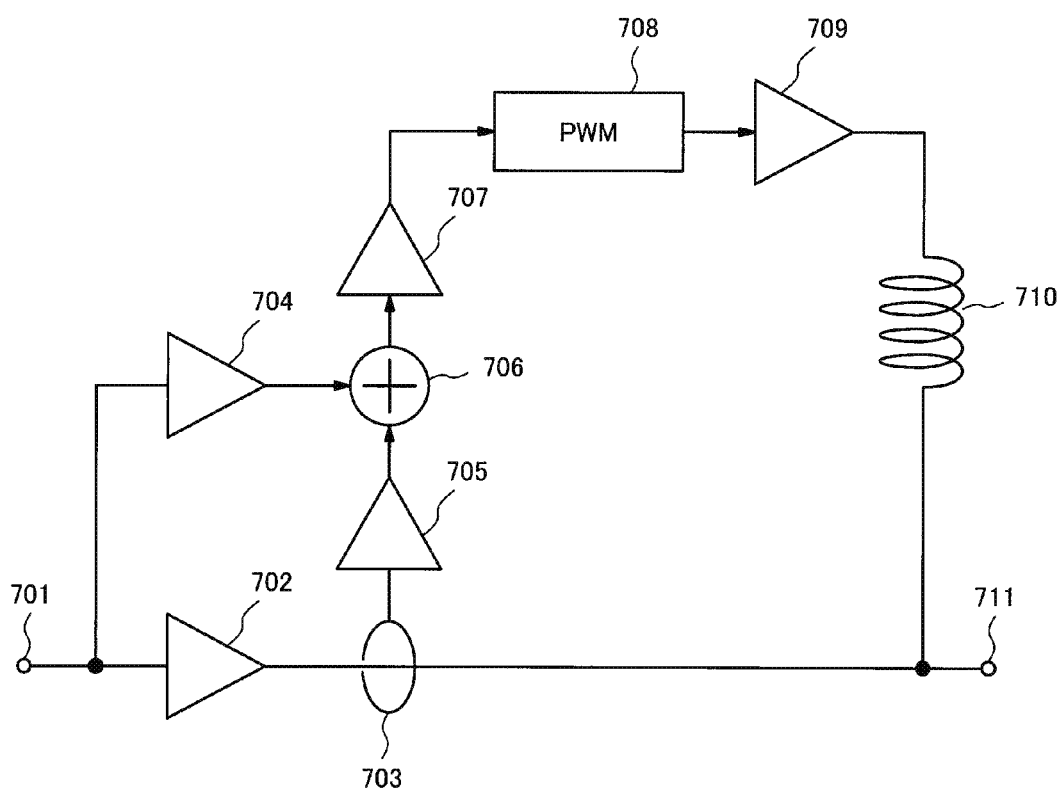
FIG. 7 A block diagram of a power supply circuit described in non-patent document 2

By the way, same as the case of the power supply circuit 103 (non-patent document 1) which has been explained in [Problems to be Solved by the Invention], when there are no time delays on the amplification route mentioned above, it becomes possible to generate an ideal pulse signal (pulse signal of which switching frequency is high) in the predicted signal generation circuit 206. However, same as the case of the power supply circuit 103 shown in FIG. 6, it is very difficult to remove this time delay itself.

Accordingly, in this exemplary embodiment, the timing the linear amplifier 204 outputs the amplified signal is later than the timing the predicted signal generation circuit 206 starts processing, and at the same time the pulse signal is generated by anticipating the output current of the linear amplifier 204 in the predicted signal generation circuit 206. That is, in this exemplary embodiment, the delay time itself is not removed, but by the structure mentioned above, the output current of the switching amplifier 207 and the output current of the linear amplifier 204 are synchronized and as a result, effects of the time delay on the amplification route mentioned above are removed.

Specifically, in the power supply circuit 201, on a route from the signal input terminal 202 to the predicted signal generation circuit 206, a feed forward circuit is arranged. By using this feed forward circuit and the delay device 203 together, it becomes possible for the predicted signal generation circuit 206 to anticipate the output current of the linear amplifier 204. By anticipating the output current of the linear amplifier 204, the effects of the time delay on the amplification route mentioned above can be reduced.

Figure 2:
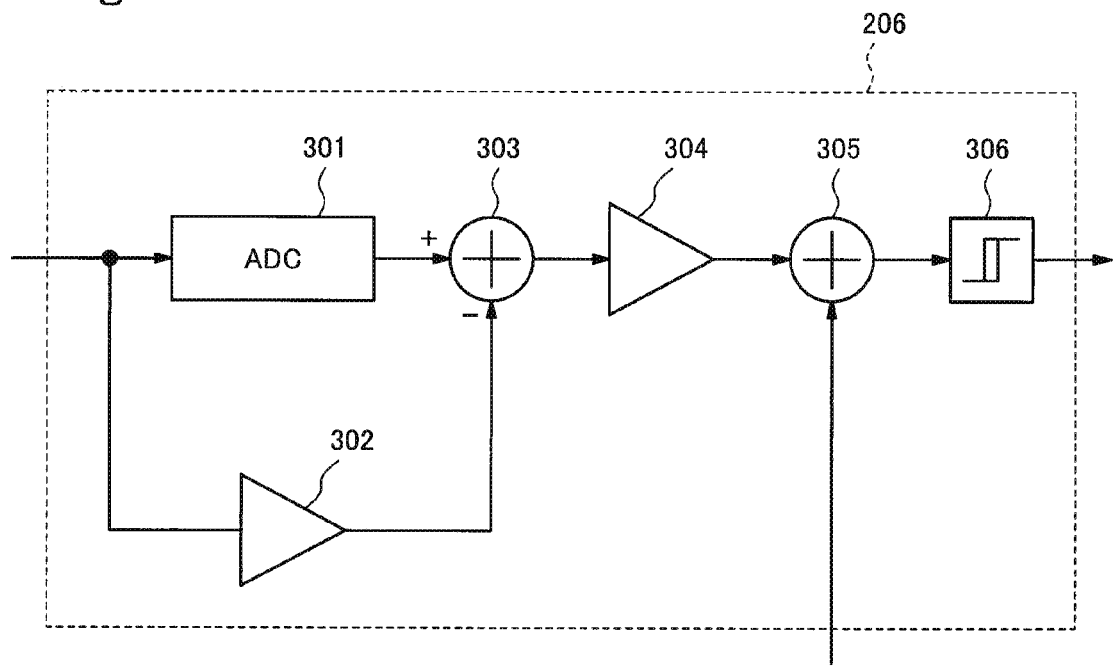

FIG. 2 is a block diagram showing an exemplary structure of the predicted signal generation circuit 206 shown in FIG. 1. The predicted signal generation circuit 206 includes: an analog-to-digital converter 301, an amplifier 302 (a third amplifier), a subtractor 303 (a first subtractor), an amplifier 304 (a fourth amplifier), an adder 305 and a comparator 306.

The analog-to-digital converter 301 converts the input signal from the signal input terminal 202 into a digital signal and outputs the digital signal.

The amplifier 302 adjusts amplitude of the input signal from the signal input terminal 202 and outputs the adjusted signal.

The subtractor 303 subtracts the output signal of the amplifier 302 from the output signal of the analog-to-digital converter 301 and outputs the subtracted signal.

The amplifier 304 adjusts amplitude of the output signal of the subtractor 303 and outputs the adjusted signal.

The adder 305 calculates a sum of the output signal of the amplifier 304 and the output signal of the current detector 205, and outputs the sum.

The comparator 306 inputs the output signal of the adder 305, performs High-Low judgment and outputs a 1 bit signal to the switching amplifier 207. Further, the comparator 306 can be composed, for example, of a 1 bit quantizer which performs only plus or minus judgment (for example, judgment of whether the input signal is no smaller than zero or not) of the input signal. Or, the comparator 306 can be composed of a hysteresis comparator (a first hysteresis comparator). The hysteresis comparator has a function to hold the last output state and a predetermined first hysteresis width (V_hys1). In the hysteresis comparator, when the last output state is Low, the output state switches to High when the input signal becomes not less than +(V_hys1/2), and on the other hand, when the last output state is High, the output state switches to Low when the input signal becomes not more than −(V_hys1/2).

Figure 3:
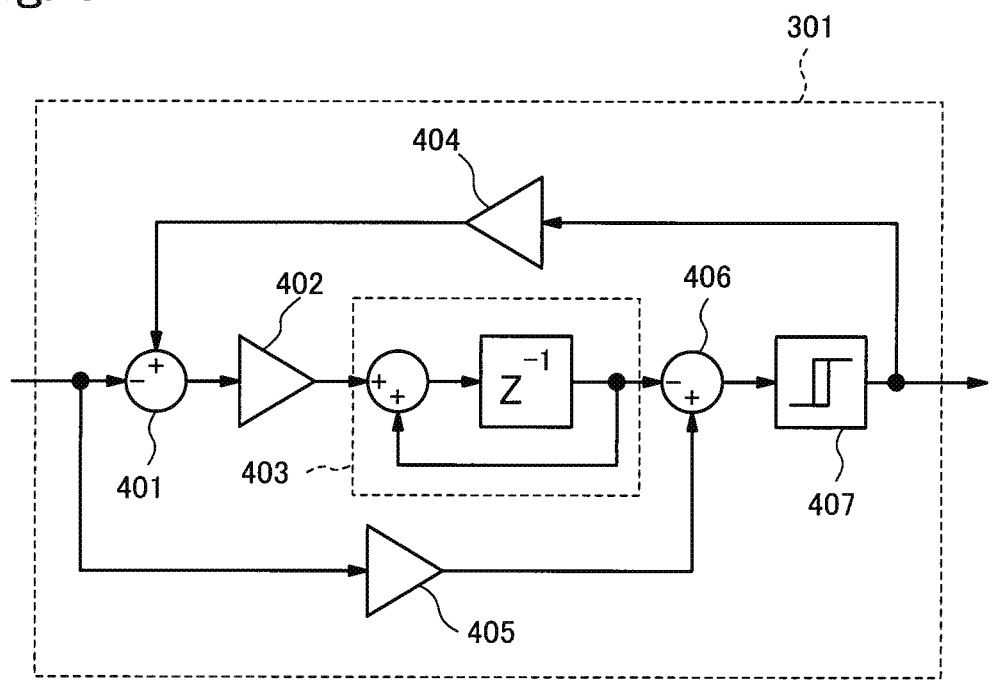
FIG. 3 A block diagram showing an exemplary structure of an analog-to-digital converter shown in FIG. 2

FIG. 3 is a block diagram showing an exemplary structure of the analog-to-digital converter 301 shown in FIG. 2. The analog-to-digital converter 301 includes: a subtractor 401 (a second subtractor), 406 (a third subtractor), an amplifier 402 (a fifth amplifier), 404 (a seventh amplifier), 405 (a sixth amplifier), an integrator 403 and a hysteresis comparator 407 (a second hysteresis comparator).

The subtractor 401 outputs a signal which is generated by subtracting the input signal from the signal input terminal 202 from the output signal of the amplifier 404 to the amplifier 402.

The amplifier 402 amplifies the output signal from the subtractor 401 and outputs the amplified signal to the integrator 403.

The integrator 403 performs time integration of the output signal from the amplifier 402 and outputs the integrated signal to the subtractor 406.

The amplifier 405 amplifies the input signal from the signal input terminal 202 and outputs the amplified signal to the subtractor 406.

The subtractor 406 outputs a value which is subtracted the output signal of the integrator 403 from the output signal of the amplifier 405 to the hysteresis comparator 407.

The hysteresis comparator 407 inputs the output signal of the subtractor 406, and outputs the judgment on plus or minus of the input signal. The hysteresis comparator 407 has a function to hold the last output state and a predetermined second hysteresis width (V_hys2). In the hysteresis comparator 407, when the last output state is Low, the output state switches to High when the input signal becomes not less than +(V_hys2/2), and on the other hand, when the last output state is High, the output state switches to Low when the input signal becomes not more than −(V_hys2/2).

The amplifier 404 amplifies the output signal of the hysteresis comparator 407 and outputs the amplified signal to the subtractor 401.

At the same time, the output signal of the hysteresis comparator 407 is output to the subtractor 303.

Figure 4:
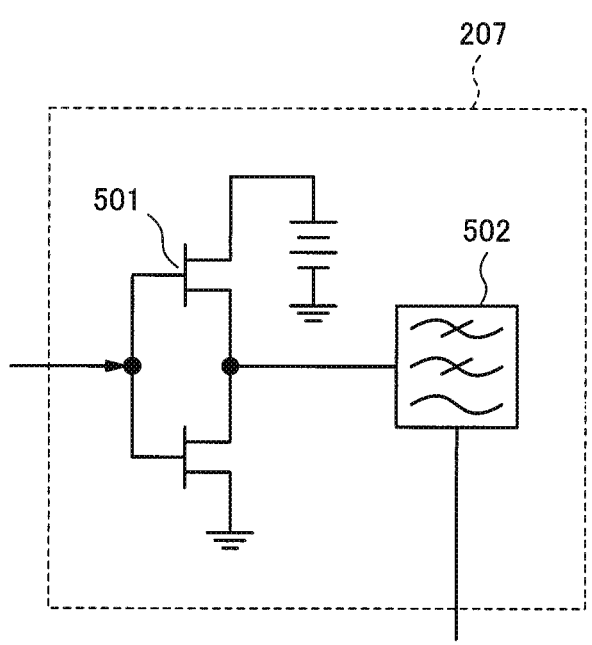
FIG. 4 A block diagram showing an exemplary structure of a switching amplifier shown in FIG. 1

FIG. 4 is a block diagram showing an exemplary structure of the switching amplifier 207 shown in FIG. 1. The switching amplifier 207 includes: a switching element 501 and a low pass filter 502.

The switching element 501 amplifies the output signal of the predicted signal generation circuit 206 and outputs the amplified signal.

The low pass filter 502 removes a noise component of high frequency from the output signal of the switching element 501, and combines the current with the output signal of the linear amplifier 204 and outputs the combined signal to the output terminal 208.

According to the first exemplary embodiment explained above, the timing of when the linear amplifier 204 outputs the amplified signal is later than the timing of when the predicted signal generation circuit 206 starts processing to generate a pulse signal, and at the same time, a pulse signal is generated by anticipating the output current of the linear amplifier 204 in the predicted signal generation circuit 206. That is, in this exemplary embodiment, the delay time itself is not removed, but by the structure mentioned above, the output current of the switching amplifier 207 and the output current of the linear amplifier 204 are synchronized and as a result, so effects of the time delay on the amplification route mentioned above are removed. Accordingly, errors of operation (errors in processing time) of the switching amplifier 207 and the linear amplifier 204 are corrected. In other words, the power supply circuit 201 can cause the switching amplifier 207 and the linear amplifier 204 to operate in coordination in a near-ideal state. As a result, the power supply circuit 201 can amplify a high-speed signal with high power efficiency.

Further, the delay time generated in the delay device 203 may be made, for example, substantially equal to a value which is subtracted the delay time generated by the linear amplifier 204 from a sum of the delay times generated by the current detector 205, the predicted signal generation circuit 206 and the switching amplifier 207. As the result, the errors of operation (the error in processing time) of the switching amplifier 207 and the linear amplifier 204 can be corrected more certainly and easily. Here, each delay time generated by the current detector 205, the predicted signal generation circuit 206, the switching amplifier 207 and the linear amplifier 204 can be calculated based on specification values or simulation results of each circuit. And, the delay time of the delay device 203 may be matched to the calculation result. For example, at time of parts selection during a design phase, the delay time may be set to an appropriate value. Or, in case a delay device for which the delay amount can be set electrically by a program or a circuit is used, for example, it may be set at the time of start-up and so on. Or, in case a delay device which can change the delay time mechanically by a dipswitch and so on is used, for example, it may be set at the time of shipment. Of course, setting of the delay time to the delay device 203 is not limited at the time of a design or shipment, and for example, it can be changed in real time during operation. For example, a computer circuit (not shown in FIG. 1) may have a structure that searches a table which sets a relation between ambient environment and each delay time and changes the delay time successively to a most suitable delay amount conforming to the present environment.

Further, the delay device 203 and the linear amplifier 204 may be made together to form one amplifier. Also, within the amplifier, position of the delay device 203 and the linear amplifier 204 may be switched with each other. That is, the linear amplifier 204 may amplify the signal input from the signal input terminal 202 and output the signal to the delay device 203, and the delay device 203 may delay the signal input from the linear amplifier 204 for a set time and output the signal input from the linear amplifier 204 to the signal output terminal 208. In this case, the predicted signal generation circuit 206 may detect the electrical current output by the delay device 203 and perform signal generation.

The Second Exemplary Embodiment

Figure 5:
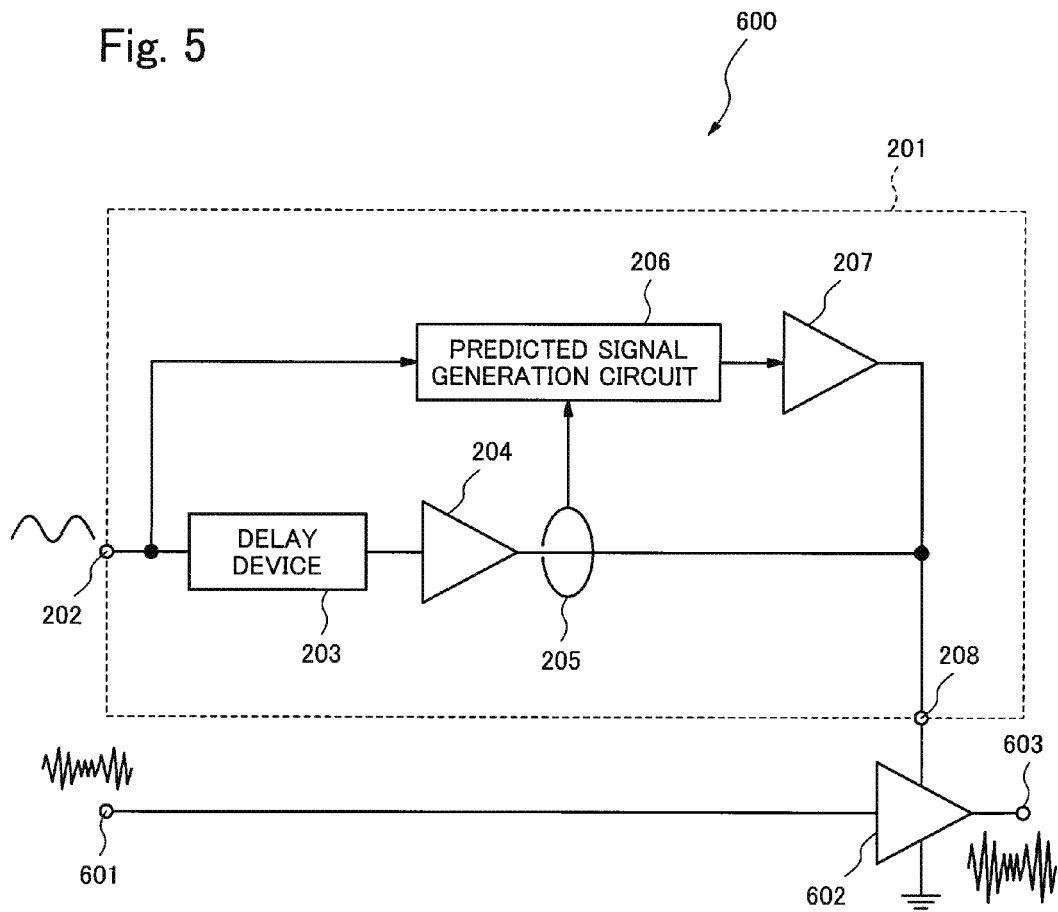
FIG. 5 A block diagram showing an exemplary structure of a high frequency power amplifier according to the second exemplary embodiment of the present invention FIG. 6 A block diagram of a high frequency power amplifier (polar modulation-type power amplifier) described in non-patent document 1

FIG. 5 is a block diagram showing an exemplary structure of a high frequency power amplifier 600 according to the second exemplary embodiment of the present invention. The high frequency power amplifier 600 includes: a high frequency modulation signal input terminal 601, a high frequency power amplifier 602, a high frequency modulation signal output terminal 603 and the power supply circuit 201.

In the high frequency power amplifier 600, a high frequency modulation signal to which an amplitude modulation or a phase modulation is applied is input to the high frequency power amplifier 602 via the high frequency modulation signal input terminal 601. On the other hand, an amplitude modulation signal of the high frequency modulation signal input from the high frequency modulation signal input terminal 601 is input to the power supply circuit 201 via the signal input terminal 202.

The signal input from the signal input terminal 202 is amplified with high efficiency in the power supply circuit 201, and the amplified signal is supplied from the signal output terminal 208 as a power supply of the high frequency power amplifier 602.

The high frequency power amplifier 602 amplifies the signal input from the high frequency modulation signal input terminal 601 and outputs the amplified signal to the high frequency modulation signal output terminal 603.

In the second exemplary embodiment explained above, the high frequency power amplifier 600 shown in FIG. 5 is a polar modulation-type power amplifier which used the power supply circuit 201 explained in the first exemplary embodiment as a power supply. As described above, the power supply circuit 201 can amplify a high-speed signal with high efficiency. Accordingly, the high frequency power amplifier 600 which adopts such power supply circuit 201 as the power supply can amplify the high frequency modulation signal of large bandwidth with high efficiency.

Incidentally, in the second exemplary embodiment explained above, the input signal input from the signal input terminal 202 can be replaced by a signal with a constant amplitude to which amplitude modulation is not applied. In this case, the high frequency power amplifier 602 has only to operate so that it is always saturated by the power supply voltage. By doing so, a signal with amplitude modulation is output from the high frequency modulation signal output terminal 603.

Also, in order to correct a time delay generated when a signal is amplified in the power supply circuit 201, the signal input from the high frequency modulation signal input terminal 601 can be delayed compared with the amplitude modulation signal input from the signal input terminal 202.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application claims priority based on Japanese Patent Application No. 2010-269253 filed on Dec. 2, 2010 and the disclosure thereof is incorporated herein in its entirety.

DESCRIPTION OF CODES

101 High frequency modulation signal input terminal
102 Amplitude signal input terminal
103 Power supply circuit
104 High frequency power amplifier
105 High frequency modulation signal output terminal
106 Linear amplifier
107 Subtractor
108 Current sensing resistor
109 Hysteresis comparator
110 Switching amplifier
111 Inductor
112 Power supply terminal
201 Power supply circuit
202 Signal input terminal
203 Delay device
204 Linear amplifier
205 Current detector
206 Predicted signal generation circuit
207 Switching amplifier
208 Signal output terminal
301 Analog-to-digital converter
302, 304, 402, 404, 405 Amplifier
303, 401, 406 Subtractor
305 Adder
306 Comparator
403 Integrator
407 Hysteresis comparator
501 Switching element
502 Low pass filter
600 High frequency power amplifier
601 High frequency modulation signal input terminal
602 High frequency power amplifier
603 High frequency modulation signal output terminal
701 Signal input terminal
702 Linear amplifier
703 Current detector
704, 705, 707 Amplifier
706 Adder
708 PWM modulator
709 Switching amplifier
710 Inductor
711 Signal output terminal

What is claimed is:

1. A power supply circuit comprising:
a first amplification unit that delays an input signal by a predetermined set time and amplifying the input signal;
a current detection unit that detects a current value of an output signal of said first amplification unit;
a predicted signal generation unit that generates a pulse signal on the basis of an output signal of said current detection unit and said input signal;
a second amplification unit that amplifies said pulse signal; and
a signal output unit that combines current of the output signal of said first amplification unit and current of the output signal of said second amplification unit to output the combined current; wherein said set time is time for reducing an effect of delay times generated at said current detection unit, said predicted signal generation unit and said second amplification unit.

2. The power supply circuit according to claim 1, wherein said set time coincides substantially with the time which is subtracted the delay time generated at the time of amplification by said first amplification unit from a sum of the delay time generated at said current detection unit, said predicted signal generation unit and said second amplification unit.

3. The power supply circuit according to claim 1, wherein said predicted signal generation unit further comprising:
an analog-to-digital conversion unit that converts said input signal into a digital signal;
a third amplification unit that amplifies said input signal by a predetermined gain;
a first subtraction unit that outputs a value which is subtracted an output signal of said third amplification unit from an output signal of said analog-to-digital conversion unit;
a fourth amplification unit that amplifies the output signal of said first subtraction unit by a predetermined gain;
an adding unit that outputs a sum of the output signal of said fourth amplification unit and the output signal of said current detection unit; and
a comparator that inputs the output signal of said adding unit, performs High-Low judgment, and outputs a judgment result as the output signal of said predicted signal generation unit.

4. The power supply circuit according to claim 3, wherein said comparator is 1 bit quantization unit that judges plus or minus of the input signal.

5. The power supply circuit according to claim 3, wherein said comparator is a first hysteresis comparator which has predetermined first hysteresis width V_hys1, inputs the output signal of said adding unit, and outputs a signal of Low when the last electric potential is High and an electric potential of the input signal becomes not more than $-(V\_hys1/2)$, and outputs a signal of High when the last electric potential is Low and the electric potential of the input signal is not less than $+(V\_hys1/2)$.

6. The power supply circuit according to claim 3, wherein said analog-to-digital conversion unit further comprising:
a second subtraction unit that outputs a value which is subtracted said input signal from a feedback signal;
a fifth amplification unit that amplifies an output signal of said second subtraction unit by a predetermined gain;
an integration unit that performs time integration of an output signal of said fifth amplification unit;
a sixth amplification unit that amplifies said input signal by a predetermined gain;
a third subtraction unit that outputs a value which is subtracted an output signal of said integration unit from an output signal of said sixth amplification unit;
a second hysteresis comparator which has predetermined second hysteresis width V_hys2, inputs the output signal of said third subtraction unit, and outputs an output signal which becomes a signal of Low when the last state is High and an electric potential of the input signal is not more than $-(V\_hys2/2)$, and which becomes a signal of High when the last state is Low and the electric potential of the input signal is not less than $+(V\_hys2/2)$, as the output signal of said analog-to-digital conversion unit; and
a seventh amplification unit that amplifies an output signal of said second hysteresis comparator by a predetermined gain, and outputs the amplified signal to said second subtraction unit as said feedback signal.

7. The power supply circuit according to claim 1, wherein said second amplification unit further comprising:
a switching unit that amplifies a pulse signal generated by said predicted signal generation unit; and
a low pass filter that removes a high frequency component from an output signal of said switching unit, and outputs the output signal of said switching unit as the output signal of said second amplification unit.

8. A high frequency power amplifier comprising:
a power amplification unit that amplifies a high frequency modulation signal; and
the power supply circuit according to claim 1 which makes an amplitude modulation component of said high frequency modulation signal as an input signal; wherein
an output signal of said power supply circuit is made a power supply of said power amplification unit.

9. A power supply control method comprising:
delaying an input signal by a predetermined set time, amplifying and outputting the amplified signal;
detecting a current value of said delayed and amplified signal;
generating a pulse signal on the basis of said detected current value and said input signal;
amplifying said pulse signal; and
combining the current of said delayed and amplified signal and said amplified pulse signal and outputting the combined signal; further wherein
said set time is time for reducing an effect of delay times generated at detection of said current value, generation of said pulse signal and amplification of said pulse signal.

10. A power supply circuit comprising:
first amplification means for delaying an input signal by a predetermined set time and amplifying the input signal;
current detection means for detecting a current value of an output signal of said first amplification means;
predicted signal generation means for generating a pulse signal on the basis of an output signal of said current detection means and said input signal;
second amplification means for amplifying said pulse signal; and
signal output means for combining current of the output signal of said first amplification means and current of the output signal of said second amplification means to output the combined current; wherein
said set time is time for reducing an effect of delay times generated at said current detection means, said predicted signal generation means and said second amplification means.

* * * * *